United States Patent [19]

Tohya et al.

[11] Patent Number: 6,075,211

[45] Date of Patent: Jun. 13, 2000

[54] MULTI-LAYERED PRINTED WIRING BOARD

[75] Inventors: Hirokazu Tohya; Shiro Yoshida, both of Tokyo, Japan

[73] Assignee: NEC Corporation, Tokyo, Japan

[21] Appl. No.: 08/713,619

[22] Filed: Sep. 13, 1996

[30] Foreign Application Priority Data

Sep. 14, 1995 [JP] Japan .................................... 7-236488
May 31, 1996 [JP] Japan .................................... 8-137904

[51] Int. Cl.⁷ ........................................................ H05K 1/03
[52] U.S. Cl. ........................... 174/255; 361/794; 361/795; 333/246
[58] Field of Search .................................. 361/748, 790, 361/795, 794; 174/250, 255, 254; 333/246

[56] References Cited

U.S. PATENT DOCUMENTS

| | | | |
|---|---|---|---|
| 4,685,033 | 8/1987 | Inoue | 361/748 |
| 5,039,964 | 8/1991 | Ideka | 333/181 |
| 5,136,471 | 8/1992 | Inasaka | 174/255 |
| 5,272,600 | 12/1993 | Carey | 174/255 |
| 5,285,018 | 2/1994 | Pence, IV | 174/255 |
| 5,365,407 | 11/1994 | Nakabayashi et al. | 174/255 |
| 5,373,112 | 12/1994 | Kamimura et al. | 174/255 |
| 5,384,683 | 1/1995 | Tsunoda | 174/255 |
| 5,428,506 | 6/1995 | Brown | 174/255 |
| 5,519,176 | 5/1996 | Goodman et al. | 174/255 |
| 5,574,630 | 11/1996 | Kresge et al. | 174/255 |
| 5,590,030 | 12/1996 | Kametani et al. | 174/255 |
| 5,633,479 | 5/1997 | Hirano | 174/255 |
| 5,796,587 | 8/1998 | Lauffer et al. | 174/255 |

FOREIGN PATENT DOCUMENTS

| | | |
|---|---|---|
| 39 08 902 | 9/1990 | Germany . |
| 61-38970 | 3/1986 | Japan . |
| 61-173167 | 10/1986 | Japan . |
| 63-300593 | 12/1988 | Japan . |
| 64-25497 | 1/1989 | Japan . |
| 3-208391 | 9/1991 | Japan . |
| 3-273699 | 12/1991 | Japan . |
| 4-3489 | 1/1992 | Japan . |
| 4-302498 | 10/1992 | Japan . |
| 4-43016 | 4/1993 | Japan . |
| 5-235679 | 9/1993 | Japan . |

OTHER PUBLICATIONS

IBM Technical Disclosure Bulletin, "*Voltage Divider Choke for Electrical Boards and Cards*", vol. 31, No. 1, pp. 95–97, Jun. 1998.

IBM Technical Disclosure Bulletin, "*Electromagnetic Noise Suppression for Electronics Cards and Boards*", vol. 33, No. 7, pp. 243–246, Dec. 1990.

Patent Abstracts of Japan, vol. 17, No. 599 (E–1455), Nov. 2, 1993; and JP 05 183274 A (Sharp Corp.), Jul. 23, 1993.

Patent Abstracts of Japan, vol. 16, No. 91 (E–1174), Mar. 5, 1992; and JP 03 273699 A (Canon), Dec. 4, 1991.

*Primary Examiner*—Deborah Jones
*Assistant Examiner*—Cathy F. Lam
*Attorney, Agent, or Firm*—Sughrue, Mion, Zinn, Macpeak & Seas, PLLC

[57] ABSTRACT

There is provided a multi-layered printed wiring board including a power supply layer, a ground layer, a signal layer, and insulators sandwiched between those layers. The power supply layer is provided with a circuit in the form of wirings for imparting impedance thereto. For instance, the power supply layer may be formed to include main wirings for distributing a dc current entirely to the printed wiring board with a dc voltage drop being depressed, and branch wirings for enhancing high frequency impedance to isolate circuits in terms of high frequency, which circuits are mounted on the multi-layered printed wiring board and operated independently with each other. The invention makes it possible to provide a relatively great inductance to thereby decrease high frequency power supply current which is generated on IC/LSI operation and is to flow into decoupling capacitors. In addition, in accordance with the present invention, it is possible to identify a route through which a current runs into the power supply layer to thereby provide an optimal decoupling capacitor to every IC/LSI as a source of high frequency power supply current.

24 Claims, 11 Drawing Sheets

MULTI-LAYERED PRINTED WIRING BOARD

BACKGROUND OF THE INVENTION

1. Field of the Invention

The invention relates to a multi-layered printed wiring board (PWB), and more particularly to a multi-layered printed wiring board on which circuit elements such as a transistor, an integrated circuit (IC) and a large scale integrated circuit (LSI) are mounted.

2. Description of the Related Art

It is well know in the field that a multi-layered printed wiring board on which circuit elements such as a transistor, an integrated circuit (IC) and a large scale integrated circuit (LSI) are mounted generates electromagnetic noises which causes malfunction of an electronic device in which the multi-layered printed wiring board is incorporated or other electronic devices.

Such electromagnetic noises are quite often caused by radiation, which is so-called common mode, to be generated due to either a current to be generated by parasitic capacitance or parasitic mutual inductance of a circuit or a high frequency current to flow into a power supply line. Since the generation mechanism of the radiation is complicated, there was no effective measures to be taken in the vicinity of a radiation source. Thus, there has been conventionally used a metal box in which an electronic device is contained for electromagnetically shielding.

FIG. 1 illustrates one of conventional measures for preventing electromagnetic noise. There has been conventionally used a decoupling capacitor 4 connected in parallel with and in the vicinity of an IC/LSI 3 connected between a power supply line composed of a power supply line 16 and a ground line composed of a ground layer 17 of a printed wiring board. Herein, the IC/ LSI 3 is a source of high frequency power supply current. A high frequency power supply current generated due to switching operation of the IC/LSI 3 and running through the power supply layer 16 is bypassed to a ground through the decoupling capacitor 4 in the vicinity of the IC/LSI 3, in addition, voltage fluctuation at a power supply terminal of the IC/LSI 3, which is generated due to the switching operation of IC/LSI 3, being depressed.

The power supply line 16 acting as a power supply line in a conventional multi-layered printed wiring board is a complete planar layer composed of complete electrically conductive material such as copper. This maximizes a plane through which a current runs and thus minimizes electrical resistance in a power supply line, thereby providing the effect of depressing the fluctuation in dc power supply voltage.

However, the above mentioned conventional multi-layered printed wiring board has a problem that a designer cannot control a high frequency power supply current accompanied with the operation of IC/ LSI and flowing into the power supply layer through the decoupling capacitor.

Specifically, in a complete planar layer, since a power supply layer has a small impedance therein, a high frequency power supply current from an IC/ LSI flows into not only a decoupling capacitor disposed in the vicinity of a certain IC/LSI, but also decoupling capacitors disposed in the vicinity of other IC/LSIs. Thus, the high frequency power supply current was distributed quite complicatedly in an entire multi-layered printed wiring board, and hence it was very difficult or almost impossible to analyze the distribution of the high frequency power supply current. Accordingly, it was impossible to determine optimal capacitance of a decoupling capacitor associated with each of IC/LSIs.

Since the power supply layer makes a complete planar layer itself, a high frequency power supply current flowing into the power supply layer runs along complicated routes, and often forms a large loop, which might cause electromagnetic radiation and immunity degradation.

For instance, as illustrated in FIG. 2, suppose a circuit including an IC/ LSI 3c from which the greatest high frequency power supply current is to run, an IC/LSI 3d from which the second greatest high frequency power supply current is to run, and an IC/LSI 3e from which the smallest high frequency power supply current is to run, which IC/LSIs are connected to both a power supply line 16 and a ground line 17 in parallel. The illustrated circuit also includes a decoupling capacitor 4d disposed in the vicinity of the IC/LSI 3c and having the greatest capacitance and hence the smallest impedance Z, a decoupling capacitor 4e disposed in the vicinity of the IC/LSI 3d and having the second greatest capacitance and hence the second smallest impedance Z, and a decoupling capacitor 4f disposed in the vicinity of the IC/LSI 3e and having the smallest capacitance and hence the greatest impedance Z. The capacitance of these IC/LSIs is determined in accordance with a high frequency power supply current running from the IC/ LSIs 3c to 3e. This circuit has problems as follows.

Since the decoupling capacitor 4f disposed in the vicinity of the IC/LSI 3e has a greater impedance than the other decoupling capacitors 3c and 3d, for instance, all of high frequency power supply current derived from the IC/LSI 3e is not bypassed to the ground line 17 through the decoupling capacitor 4f, and thus a part of high frequency power supply current flows into the IC/LSI 3c or 3d, which makes a large current loop area. As a result, there may occur a problem that electromagnetic noises are increased, and accordingly the immunity is degraded.

In the case that the high frequency power supply current derived from the IC/ LSI 3e is not bypassed through the decoupling capacitor 4f disposed in the vicinity thereof, the introduction of the high frequency power supply current into other capacitors causes that an impedance is increased in a line where the high frequency power supply current is to run. As a result, the fluctuation in ac voltage is enlarged, which exerts a harmful influence on stable operation of the IC/ LSI 3e itself.

Thus, as explained earlier, there has been conventionally used a box in which an electronic device is contained for electromagnetic shielding. However, the metal box has to be formed with an opening through which the electronic device is handled. Accordingly, it was impossible to prevent external leakage of electromagnetic noises.

Japanese Unexamined Patent Publication No. 5-235679 published on Sep. 10, 1993 has suggested a printed wiring board in which at least one of ground patterns on a circuit board is made as a ground pattern to be used for a noise removing filter. The one of ground patterns is connected to a ground section of a circuit element located closest to a noise source.

Japanese Unexamined Patent Publication No. 4-302498 published on Oct. 26, 1992 has suggested a printed wiring board including insulating layers formed on circuit patterns and electrically conductive layers to be connected to a ground pattern, thereby preventing occurrence of radiation of high frequency noise derived from signal lines.

Japanese Unexamined Patent Publication No. 4-3489 published on Jan. 8, 1992 has suggested a method of forming transmission lines on a printed wiring board. The method includes the steps of forming a pattern on one of surfaces of a substrate, forming an insulating layer with which the pattern is covered, depositing an electrically conductive layer over the insulating layer to thereby define a transmission line with the pattern, insulating layers and electrically conductive layers, and removing copper foils deposited on the other surface of the substrate which foils may exert an influence on the transmission line.

Japanese Unexamined Utility Model Publication No. 4-43016 published on Apr. 13, 1992 has suggested a print filer comprising a film printed on upper and lower surfaces thereof in the form of coil and capacitor wiring patterns, and magnetic substances deposited on the upper and lower surfaces of the film to thereby establish a coil having a closed magnetic pass.

Japanese Unexamined Patent Publication No. 3-273699 published on Dec. 4, 1991 has suggested a printed wiring board having a through hole and a plurality of pattern surfaces, characterized by magnetic substance layers sandwiched between the pattern surfaces.

Japanese Unexamined Patent Publication No. 3-208391 published on Sep. 11, 1991 has suggested a hybrid integrated circuit parts in which a compound inductor composed of a layered structure of magnetic substance and conductive material and a compound capacitor composed of a layered structure of dielectric material and conductive material are overlapped to define a single-piece substrate. The substrate is formed with a recessed portion on which the electronic parts are to be mounted.

Japanese Unexamined Patent Publication No. 64-25497 published on Jan. 27, 1989 has suggested an inductance element including a first electrically conductive layer formed on an insulating substrate, a magnetic substance layer formed over the first electrically conductive layer, and a second electrically conductive layer formed on the first electrically conductive layer, covering the magnetic substance layer therewith.

Japanese Unexamined Patent Publication No. 63-300593 published on Dec. 7, 1988 has suggested a ceramic compound substrate comprising a first magnetic substance substrate having a certain magnetic permeability, a coil pattern made of electrically conductive material and printed on the first magnetic substance substrate, and having at distal ends internal electrodes to be connected to another circuit, and a second magnetic substance substrate formed on the coil pattern and cooperating with the coil pattern and the first magnetic substance substrate to establish an inductance element having a certain value of inductance.

Japanese Unexamined Utility Model Publication No. 61-173167 published on Oct. 23, 1986 has suggested a compound inductor substrate including a plurality of inductance elements composed of a layered structure of 8-figure shaped conductive patterns and magnetic substance layers, the inductance elements being arranged transversely of the FIG. 8s, the magnetic substance layer being formed with a groove extending transversely of the FIG. 8s across crosspoints of the FIG. 8s.

Japanese Unexamined Utility Model Publication No. 61-38970 published on Mar. 11, 1986 has suggested a printed wiring board including a substrate, a pattern made of copper foil and formed over the substrate, first resist applied to cover the pattern therewith for isolation of the pattern, resin containing magnetic powder and applied on an upper surface of the first resist, and second resist applied on an upper surface of the resin.

SUMMARY OF THE INVENTION

In view of the foregoing problems of the prior art, it is an object of the present invention to provide a multi-layered printed wiring board which is capable of decreasing a high frequency power supply current which is generated due to operation of an IC/LSI and is to flow into a decoupling capacitor.

Another object of the present invention is to provide a multi-layered printed wiring board which is capable of controlling a high frequency power supply current generated due to operation of an IC/LSI which current is to flow into a power supply layer and causes radiation noise.

A further object of the present invention is to provide a multi-layered printed wiring board capable of stably operating IC/LSIs mounted thereon.

A still further object of the present invention is to provide a multi-layered printed wiring board capable of remarkably reducing radiation noise.

There is provided a multi-layered printed wiring board including at least one power supply layer, at least one ground layer, at least one signal layer, and insulators sandwiched between the layers. The power supply layer is provided with a circuit in the form of wirings for imparting impedance thereto.

It is preferable that the insulators sandwiching the power supply layer therebetween contain magnetic substance therein.

The power supply layer may be preferably interposed between the ground layers with the insulators sandwiched between the power supply layers and the ground layers.

It is preferable that the insulators other than the magnetic substance containing insulators are insulators having only dielectric characteristics.

The ground layers are preferably complete planar layers having no wirings and holes thereon except through holes and via holes. This advantageously ensures a minimum return path of a signal line, namely a minimum route of return current.

The circuit for imparting impedance is composed preferable of line patterns providing a greater inductance in limited regions than an inductance to be generated in other regions. In addition, it is preferable that the impedance imparting circuit is composed of at least one of winding, intersecting and spiral line patterns. Such patterns advantageously ensures a longer line length.

It is preferable that the insulators sandwiching the supply layer therebetween is made of Sendust powder, NiZn family sintered ferrite or mixture of ferrite powder and resin.

As mentioned above, a multi-layered printed wiring board in accordance with the present invention is characterized by that the power supply layer is provided with a circuit in the form of wirings for imparting impedance thereto. For instance, the impedance imparting circuit may be formed as a winding or meandering line pattern 11 as illustrated in FIG. 6A. The winding line pattern 11 has a longer line length than a straight line pattern simply connecting two points with each other. Since an inductance of a line pattern is in proportion to a line length, the impedance imparting circuit having the winding line pattern 11 can have a greater inductance than a circuit having a straight line pattern. As a result, it is possible to have a greater inductance without using any elements.

When a great line inductance is necessary to establish, but there is a real restriction in a printed wiring board, it is advantageous to adopt a spiral line pattern 13 as illustrated in FIG. 6C. An inductance is increased in proportion to a line length in the winding line pattern 11, whereas the spiral line pattern 13 advantageously provides an inductance in proportion to a square of the number of turns in the spiral.

The spiral line pattern may be in direct connection with the power supply layer at one end and is in connection with the power supply layer at the other end through one of the ground layer and a surface layer.

In other words, on establishing the spiral line pattern 13, it is necessary that a wiring starting from an internal end 18 of the spiral line pattern 13 is extended to a ground layer through a via hole and to form a line pattern in a line length as short as possible, or that a wiring is extended through a via hole to a surface layer on which an electronic element is mounted and is connected on the surface layer to a capacitor under a low impedance, and then is extended back to a power supply layer.

Comparing a conventional complete planar power supply layer to a power supply layer of the present invention to which the impedance imparting circuit is provided, the power supply layer of the present invention to which the impedance imparting circuit is provided is characterized by that a designer can identify a path in which a current runs, and that it is possible to determine an optimal decoupling capacitor for each of IC/LSIs as a source of high frequency power supply current.

The impedance imparting circuit may be in the form of an intersecting or cross type line pattern 12 as illustrated in FIG. 6B. As an alternative, the intersecting line pattern 12 may be used in combination with the winding line pattern 11 and/or the spiral line pattern 13. The intersecting line pattern 12 is simplification of the winding line pattern 11. It should be noted that a shape of a line pattern is not limited to those illustrated in FIGS. 6A to 6C.

Herein, as illustrated in FIG. 7, suppose a layered structure comprising a metallic plate 14 and planar magnetic layer 15 formed on the metallic plate 14. An impedance Z per unit area of the layered structure between A—A' is calculated in accordance with the following equation:

$$Z = Psd + j\omega\mu_0(\mu_a - 1)d$$

wherein "Psd" denotes an impedance caused by skin effect, "$j\omega\mu_0(\mu_a-1)d$" denotes an impedance caused by the magnetic layer 15, "$\mu_0$" denotes magnetic permeability of vacuum, "$\mu a$" denotes relative magnetic permeability of the magnetic layer 15, and "d" denotes thickness of the magnetic layer 15.

Thus, suppose that the power supply layer on which the impedance imparting circuit is formed corresponds to the metallic plate 14 in FIG. 7, it is possible to increase an impedance Z of the power supply layer by making the insulators sandwiching the power supply layer therebetween of magnetic material containing magnetic substance corresponding to the magnetic layer 15. As a result, it is possible to increase a line impedance of the power supply layer, and increase a wiring inductance of the power supply layer by the magnetic layer 15.

Hereinbelow will be explained a reason for providing wiring distributed inductance of the power supply layer by means of the impedance imparting circuit. As illustrated in FIG. 9, suppose a circuit including an IC/LSI 3c from which the greatest high frequency power supply current is to run, an IC/LSI 3d from which the second greatest high frequency power supply current is to run, and an IC/LSI 3e from which the smallest high frequency power supply current is to run, which IC/LSIs are connected to both a power supply line 16 and a ground line 17 in parallel. The illustrated circuit also includes a decoupling capacitor 4d disposed in the vicinity of the IC/LSI 3c and having the greatest capacitance and hence the smallest impedance Z, a decoupling capacitor 4e disposed in the vicinity of the IC/LSI 3d and having the second greatest capacitance and hence the second smallest impedance Z, and a decoupling capacitor 4f disposed in the vicinity of the IC/LSI 3e and having the smallest capacitance and hence the greatest impedance Z. The capacitance of these IC/LSIs is determined in accordance with a high frequency power supply current running from the IC/LSIs 3c to 3e. The circuit illustrated in FIG. 9 is different from the circuit illustrated in FIG. 2 in that inductances 10a, 10b and 10c are disposed between the IC/LSIs 3c to 3e and a voltage supply 18, respectively.

If the inductances 10a to 10c are not disposed in such a manner as illustrated in FIG. 9, since the decoupling capacitors 4d to 4f have different impedances, for instance, the decoupling capacitor 4f disposed in the vicinity of the IC/LSI 3e has the greatest impedance, all of high frequency power supply current derived from the IC/LSI 3e is not bypassed to the ground line 17 through the decoupling capacitor 4f, and thus a part of high frequency power supply current may flow into the IC/LSI 3c and/or 3d. Namely, only the decoupling capacitors 4d to 4f cannot isolate the IC/LSIs 3c to 3e from one another in terms of high frequency.

On the other hand, by providing the inductances 10a, 10b and 10c to the power supply layer 16, as illustrated in FIG. 9, it is possible to cause high frequency power supply current derived from the IC/LSIs 3c to 3e to bypass through the decoupling capacitors 4d to 4f disposed in the vicinity thereof to thereby make a current loop small and thus prevent the high frequency power supply current from flowing into the other IC/LSIs. As a result, the IC/LSIs 3c to 3e can be isolated from one another in terms of high frequency.

The present invention further provides a multi-layered printed wiring board including (a) at least one power supply layer including main wirings for distributing a dc current entirely to the printed wiring board with a dc voltage drop being depressed, and branch wirings for enhancing high frequency impedance to isolate circuits in terms of high frequency, which circuits are mounted on the multi-layered printed wiring board and operated independently with each other, (b) at least one ground layer, (c) at least one signal layer, and (d) insulators sandwiched between the layers.

There is still further provided a multi-layered printed wiring board including (a) at least one power supply layer including main wirings for distributing a dc current entirely to the printed wiring board with a dc voltage drop being depressed, and branch wirings for enhancing high frequency impedance to isolate circuits in terms of high frequency, which circuits are mounted on the multi-layered printed wiring board and operated independently with each other, (b) at least one ground layer, at least one signal layer, (d) insulators sandwiched between the layers, (e) a first capacitor connected to a junction between each of the branch wirings and each of the circuits, the first capacitor being suitable for high frequency power supply current characteristic of the circuits, and (f) a second capacitor connected to a junction between the main and branch wirings for assisting operation of the first capacitor.

The branch wirings correspond to the above mentioned circuit for imparting impedance. The first and second capacitors may be decoupling capacitors.

It is preferable that the magnetic substance containing insulators have magnetic permeability having both a real number part which is not decreased in a predetermined frequency band and an imaginary number part which has uniform characteristics in the predetermined frequency band. Namely, as illustrated in FIG. 8A, it is preferable that the real number part $\mu_1$ of the magnetic permeability $\mu$ of the magnetic substance containing insulators tends to be decreased in a small degree at a frequency greater than a predetermined frequency and the imaginary number part $\mu_2$ of the magnetic permeability $\mu$ tends to be increased in a small degree at a frequency greater than the predetermined frequency. Herein, the predetermined frequency may be selected to be a few hundred MHz, as illustrated in FIG. 8A.

The reason for using the above mentioned magnetic substance containing insulators is that when there cannot be obtained a sufficient distributed inductance by the above mentioned impedance imparting circuit, the use of the above mentioned magnetic substance containing insulators provides an advantage of increasing the distributed inductance in proportion to the real number part $\mu_1$ of the magnetic permeability $\mu$. It is necessary for the real number part $\mu_1$ of the magnetic permeability $\mu$ of the magnetic substance containing insulators to have small drop-tendency at a frequency greater than a few hundred MHz in order to isolate high frequency power supply currents flowing from IC/LSIs to power supply wirings in terms of high frequency among circuits composed of IC and/or other active elements and considered independent of each other.

On the other hand, the imaginary number part $\mu_2$ of the magnetic permeability $\mu$ of the magnetic substance containing insulators acts as a resistor, and has a function of decreasing an impedance at a high frequency oppositely to a function of compensating for an inductance. Thus, it is necessary for the imaginary number part $\mu_2$ of the magnetic permeability $\mu$ to have small increase-tendency at a frequency greater than a few hundred MHz.

It is preferable that the magnetic substance contained in the insulators has hysteresis characteristic which is not saturated, but excited with a dc current running through circuits mounted on the multi-layered printed wiring board and operated independently with each other. In other words, the insulators may preferably contain magnetic substance having both relatively great saturation magnetic flux density Bs and relatively small residual magnetic flux density Br, and also having a characteristic that independent circuits mounted on the multi-layered printed wiring board can be excited with a certain amperes of current, for instance, a few amperes of current. Namely, it is necessary that the hysteresis characteristic in magnetization curve called B-H curve as illustrated in FIG. 8B is not saturated, but able to be excited with a certain amperes of current, for instance, a few amperes of current. In FIG. 8B, an ordinate axis B indicates magnetic flux density, and an abscissa axis H indicates magnetic field which is in proportion to a current.

As a high frequency power supply current to run through the impedance imparting circuit, a high amperes of current may run in a moment like a through current which would be generated at switching operation of IC/LSI. In such a case, the magnetic substance containing insulators have to be able to be excited.

The above mentioned present invention provides various advantages as follows.

In accordance with the present invention, a relatively great inductance can be established without using any elements by providing a power supply layer with an impedance imparting circuit. Thus, it is possible to reduce a high frequency power supply current to be generated due to operation of IC/ LSI and to flow into decoupling capacitors mounted in a wide area.

In addition, in accordance with the present invention, a designer can identify a path in which a current runs into a power supply layer, and hence it is possible to determine an optimal decoupling capacitor for each of IC/LSIs as sources of a high frequency power supply current.

By making insulators sandwiching a power supply layer therebetween of insulators containing magnetic substance, it is possible to make an impedance of a power supply layer greater to thereby enhance the above mentioned effect, and it is also possible to determine optimal capacitance of decoupling capacitors for each of IC/ LSIs to thereby make it easy to decrease ac voltage fluctuation at a power supply terminal of IC/LSIs. As a result, each of IC/LSIs can operate stably.

In accordance with the present invention, the filtering effect of the decoupling capacitors can be enhanced by providing a power supply layer with an impedance imparting circuit. Thus, it is possible to depress occurrence of radiation noises. In addition, the impedance imparting circuit cooperates with the magnetic substance containing insulators sandwiching the power supply layer therebetween to thereby remarkably depress electromagnetic radiation derived from a multi-layered printed wiring board.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 4:
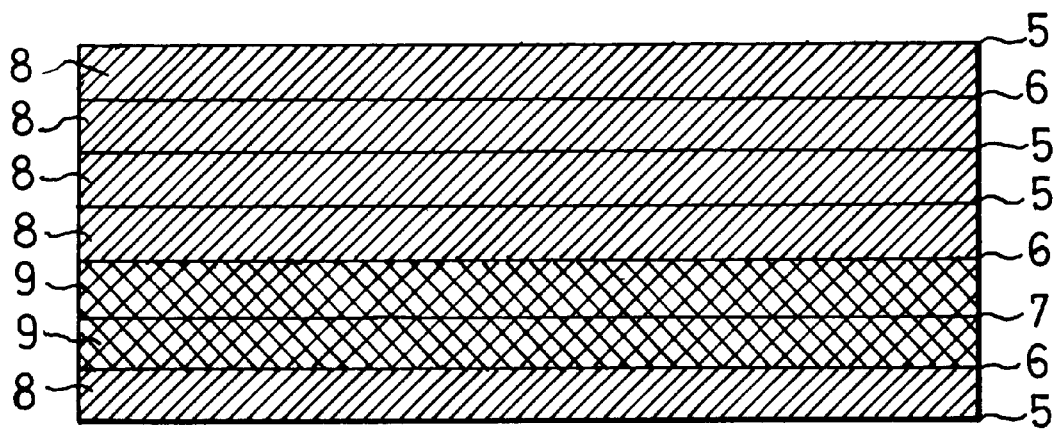
FIG. 4 is a cross-sectional view of a multi-layered printed wiring board made in accordance with the first embodiment of the present invention.

As illustrated in FIG. 4, a multi-layered printed wiring board made in accordance with the first embodiment of the present invention is comprised of an eight-layered printed wiring board including totally eight layers of signal layers 5, ground layer 6 and a power supply layer 7 which are deposited with insulators 8 and 9 sandwiched therebetween.

Specifically, there are deposited a signal layer 5, a ground layer 6, a signal layer 5, a signal layer 5, a ground layer 6, a power supply layer 7, a ground layer 6 and a signal layer 5 from a summit to a bottom in this order. Between the signal layers 5 and between the signal layer 5 and the ground layer 6 are sandwiched the insulators 8 having only dielectric characteristic, whereas insulators sandwiching the power supply layer 7 therebetween are insulators 9 containing magnetic substance. For instance, the insulators 9 contain Sendust powder, NiZn family sintered ferrite or mixture of ferrite powder and resin as magnetic substance.

Figure 1:
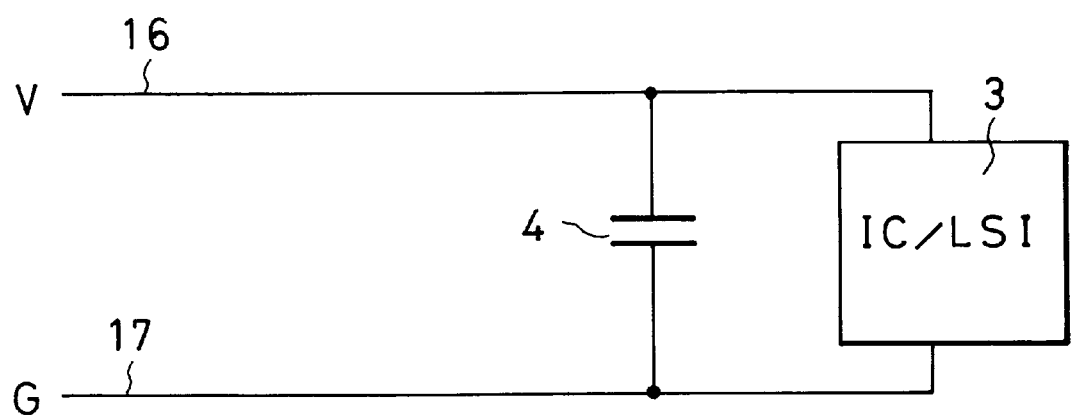
FIG. 1 is a schematic view illustrating a conventional circuit including a decoupling capacitor disposed in the vicinity of IC/LSI.
Figure 2:
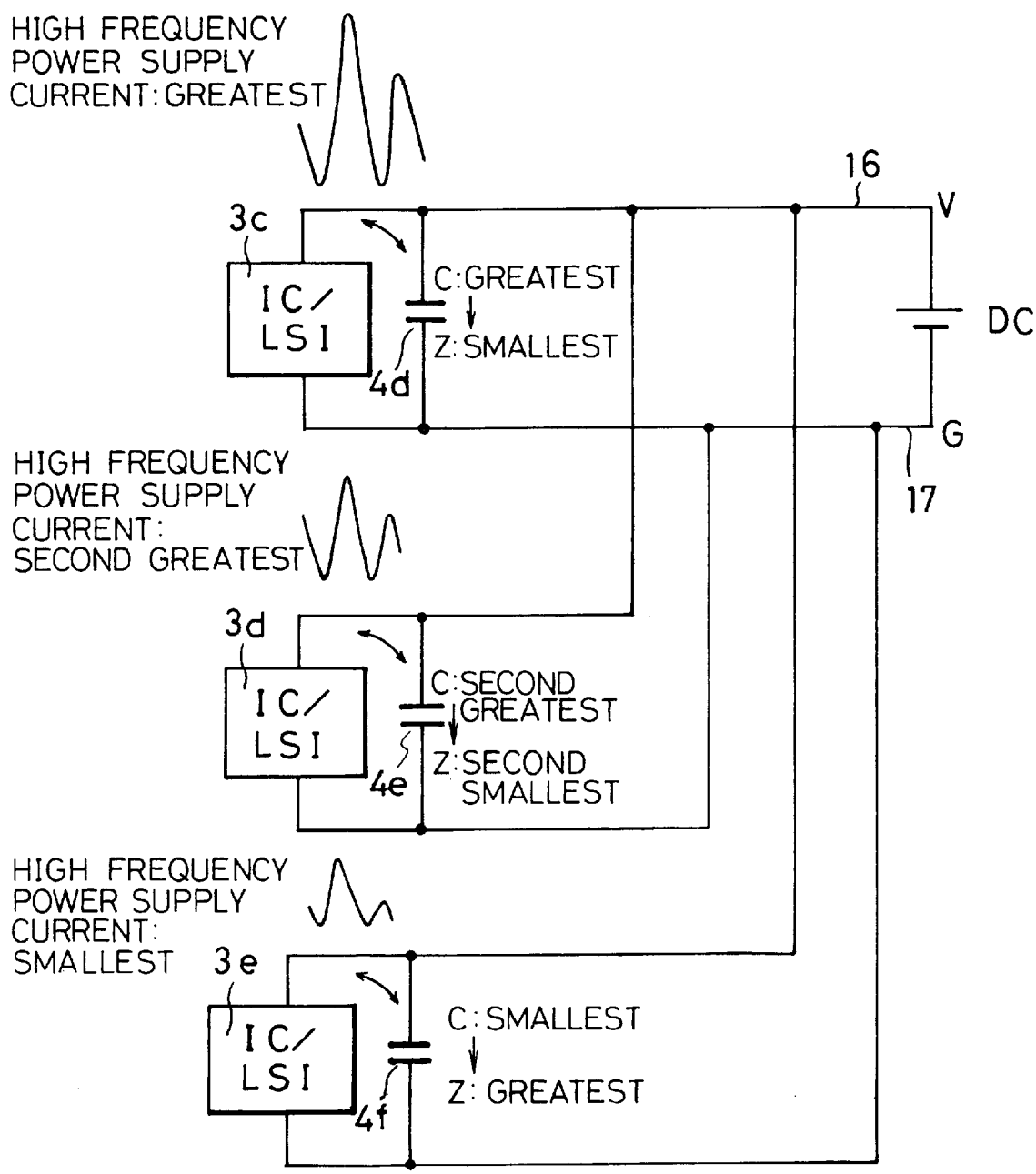
FIG. 2 is a plan view illustrating a conventional circuit including decoupling capacitor disposed in the vicinity of IC/LSIs.
Figure 3:
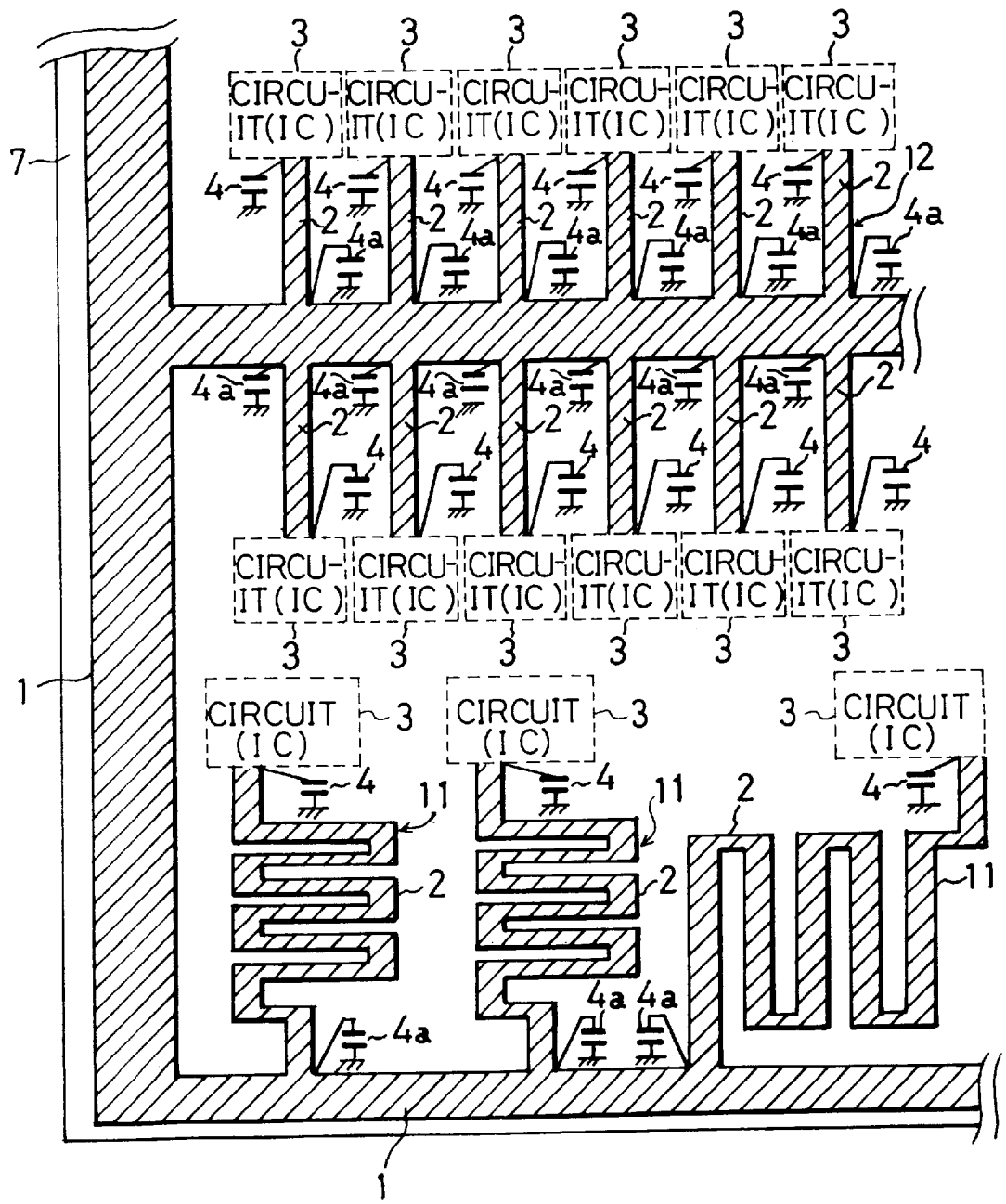
FIG. 3 is a plan view illustrating a power supply layer of a multi-layered printed wiring board made in accordance with the first embodiment of the present invention.
Figure 6A:
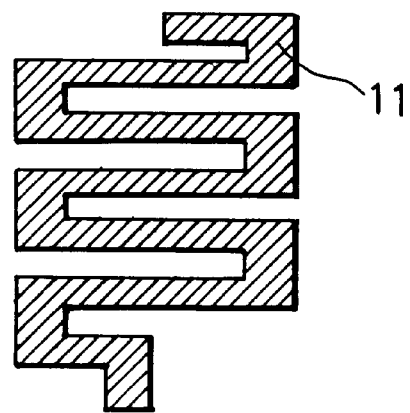
FIGS. 6A, 6B and 6C are plan views of circuits for imparting impedance.
Figure 6B:
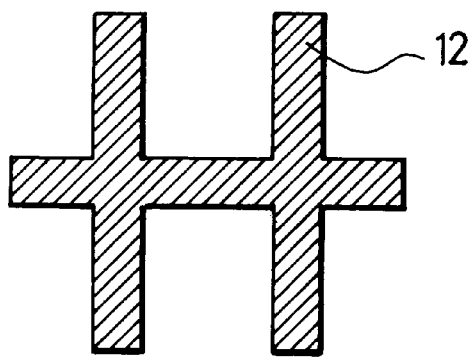

As illustrated in FIG. 3, the power supply layer 7 is provided thereon with a main wiring 1 and a plurality of branch wirings 2. The main wiring 1 is patterned with copper foil and is made for the purpose of distributing a dc current to the whole printed wiring board with a dc voltage drop being depressed. The branch wirings 2 are made for the purpose of enhancing high frequency impedance in order to isolate circuits 3 with respect to high frequency. The circuits 3 are mounted on the multi-layered printed wiring board and operated independently with each other. The branch wirings 2 of which the impedance imparting circuit is constituted include a combination of the winding line pattern 11 illustrated in FIG. 6A and the intersecting line pattern 12 illustrated in FIG. 6B.

A first decoupling capacitor 4 as a first capacitor is connected under a low impedance to a junction between each of the branch wirings 2 and each of the independent circuits 3. The first decoupling capacitor 4 is suitable for high frequency power supply current characteristic of the associated circuit 3. Similarly, a second decoupling capacitor 4a as a second capacitor is connected to a junction between the main wiring 1 and each of the branch wirings 2. The second decoupling capacitor 4a has a function of assisting operation of the first decoupling capacitor 4.

The circuits 3 considered independent from one another is constituted of IC and/or other active elements. In FIG. 3, the circuits 3 and decoupling capacitors 4, 4a are mounted not on the power supply layer 7, but on a signal layer, and are electrically connected to the power supply layer 7 through via holes (not illustrated).

The use of the magnetic substance containing insulators 9 sandwiching therebetween the power supply layer 7 on which the impedance imparting circuit in the form of wirings is formed makes it possible to increase a line impedance of the power supply layer 7 relative to a conventional complete planar power supply layer. In addition, the use of the insulators 9 containing magnetic substance therein enhances a line inductance of the power supply layer 7.

Figure 5:
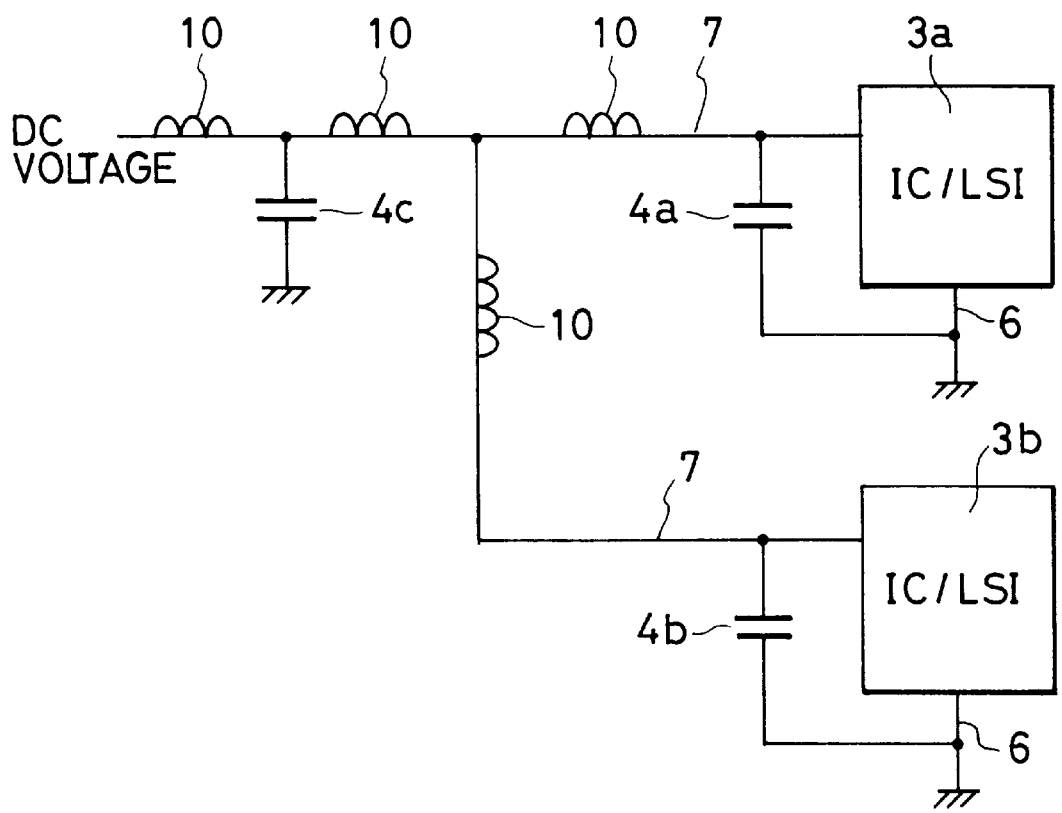
FIG. 5 is a schematic view illustrating a power supply circuit mounted on a multi-layered printed wiring board made in accordance with the present invention.

Herein, suppose a power supply circuit as illustrated in FIG. 5. The circuit includes IC/LSIs 3a and 3b each of which is connected between a power supply line constituted of the power supply layer 7 and a ground line constituted of the ground layer 6, decoupling capacitors 4a and 4b connected between the power supply line 7 and the ground line 6 and in parallel with the IC/LSIs 3a and 3b, respectively, and a decoupling capacitor 4c connected in series to both the decoupling capacitors 4a, 4b and the IC/LSIs 3a, 3b and grounded. It is possible to have the distributed inductance 10 by means of wirings of the impedance imparting circuit formed on the power supply layer 7 by establishing the circuit illustrated in FIG. 5 on the above mentioned multi-layered printed wiring board.

The distributed inductance 10 cooperates with the decoupling capacitors 4a, 4b and 4c to constitute a filter to thereby depress a high frequency power supply current accompanied with the operation of IC/LSI and flowing into the power supply line. Since the inductance value of the distributed inductance can be controlled in accordance with a structure of an impedance imparting circuit formed on the power supply layer 7, it is possible to determine a desired constant of the above mentioned filter.

Thus, by disposing the decoupling capacitors 4a and 4b in parallel with the IC/LSIs 3a and 3b carrying out switching operation, it is possible to remarkably reduce a high frequency power supply current which is generated due to the operation of IC/LSI and is to flow into a power supply line, comparing to the conventional printed wiring board. As a result, it is possible to sufficiently depress electromagnetic radiation derived from the multi-layered printed wiring board. Accordingly, it is also possible to depress electromagnetic radiation externally leaked out of a conventional metal box, and as the case may be, it is no longer necessary to use a metal box.

Figure 6C:
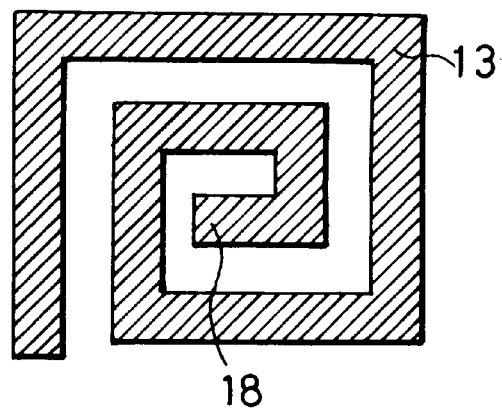
Figure 7:
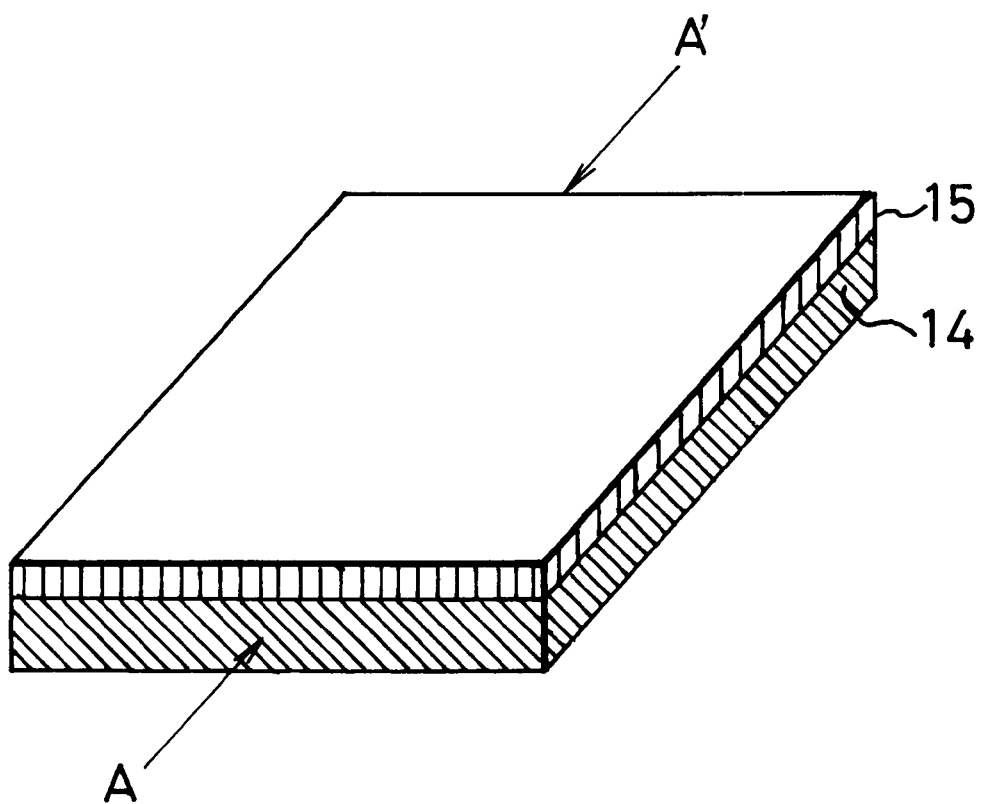
FIG. 7 is a perspective view of a layered structure for explaining the functions of the present invention.
Figure 8A:
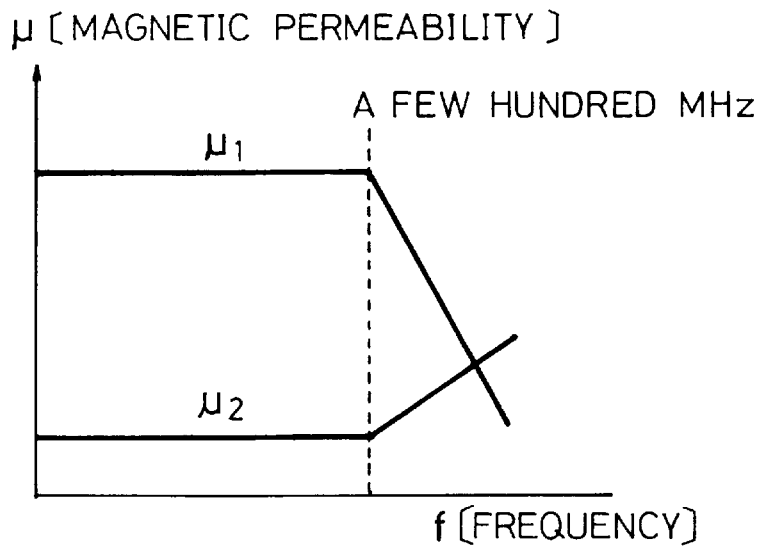
FIG. 8A illustrates relationship between magnetic permeability and frequency in magnetic substance to be used in the present invention.
Figure 8B:
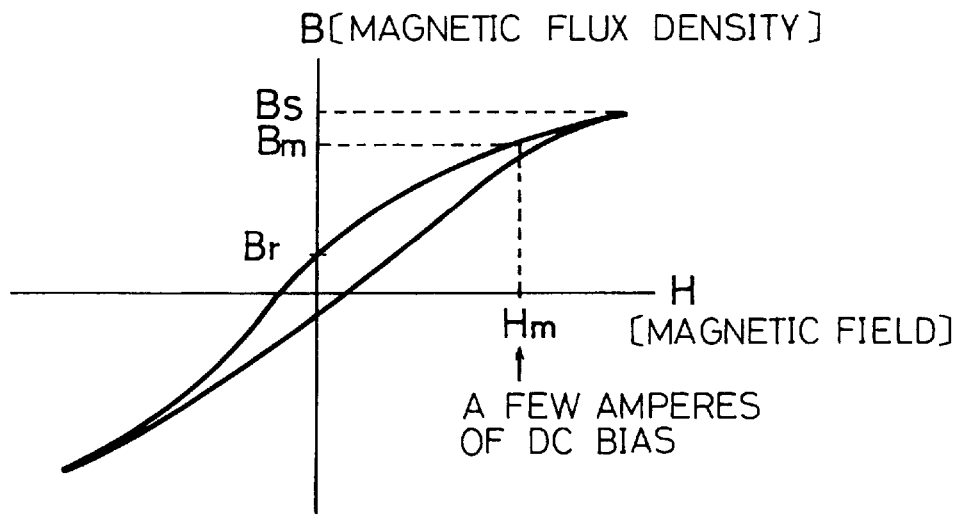
FIG. 8B illustrates relationship between magnetic flux density and magnetic field in magnetic substance to be used in the present invention.
Figure 9:
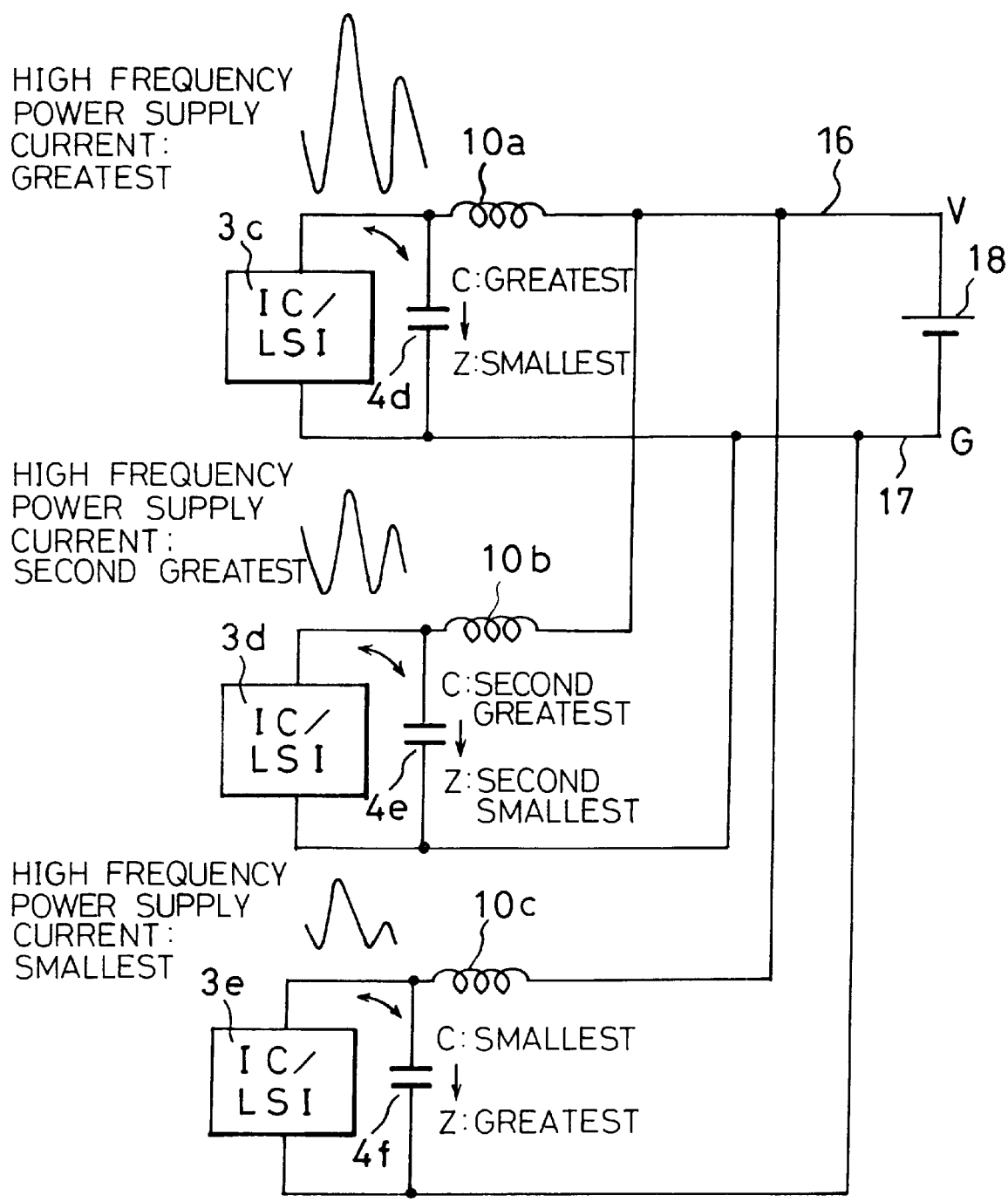
FIG. 9 is a plan view illustrating an example of a circuit to which the present invention is applied.

It should be noted that the present invention is not to be limited to the above mentioned embodiment. For instance, the impedance imparting circuit may be made in the form other than those illustrated in FIGS. 6A to 6C. The number of layers in the multi-layered printed wiring board and the structure of each of the layers are not to be limited to those illustrated in FIG. 4.

Figure 10:
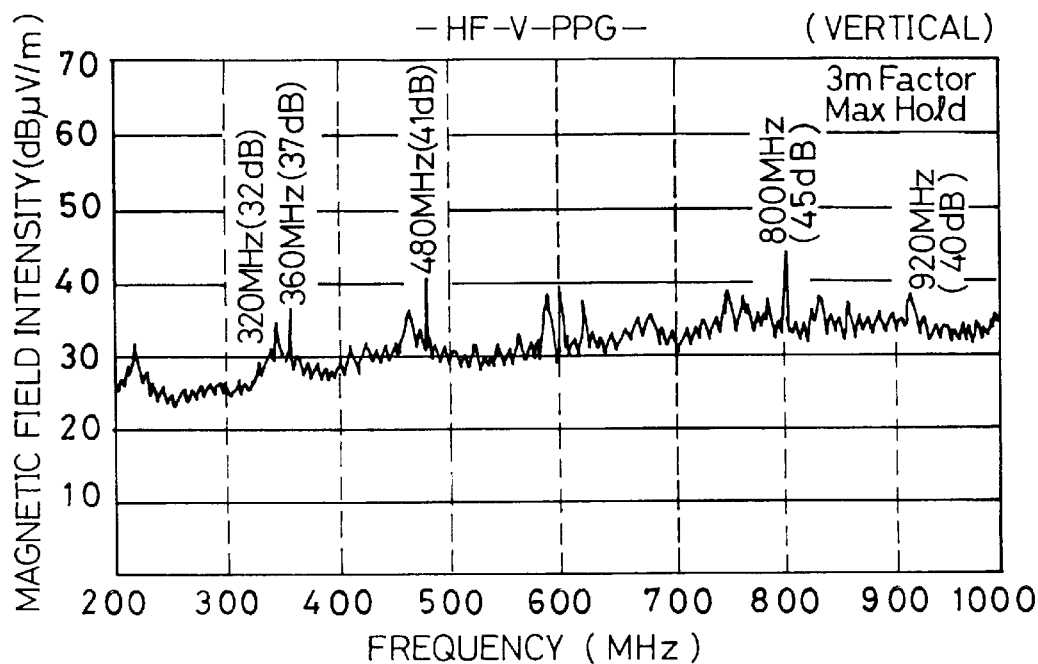
FIG. 10A is a graph showing depression effects against radiation magnetic field in a substrate to which the present invention is not applied.
FIG. 10B is a graph showing depression effects against radiation magnetic field in a substrate to which the present invention is applied.
Figure 10:
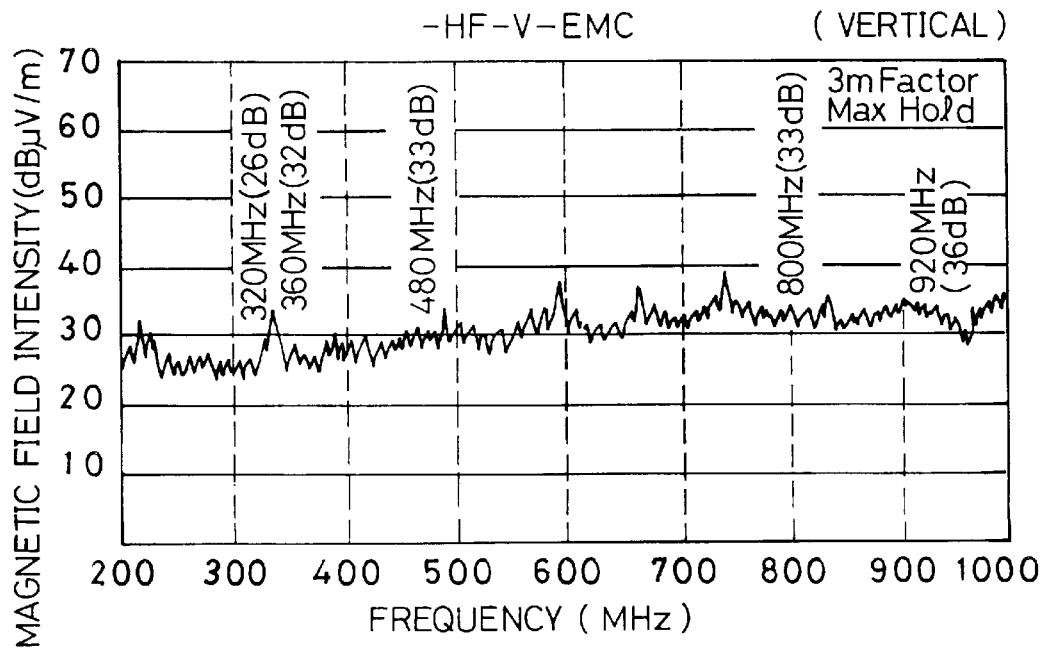

FIGS. 10A and 10B show the results of measuring radiation magnetic field derived from an electronic device, specifically an engineering work station (EWS). FIG. 10A shows the result for a printed wiring board having a complete planar power supply layer, and FIG. 10B shows the result for a printed wiring board having a power supply layer provided with an impedance imparting circuit in accordance with the present invention.

Comparing the result of FIG. 10B to the result of FIG. 10A, it is found out that the spectrum (320 MHz, 360 MHz, 480 MHz, 800 MHz, 920 MHz) at multiplied clock frequency (40 MHz) is remarkably depressed, and thus electromagnetic radiation is surely reduced.

Figure 11A:
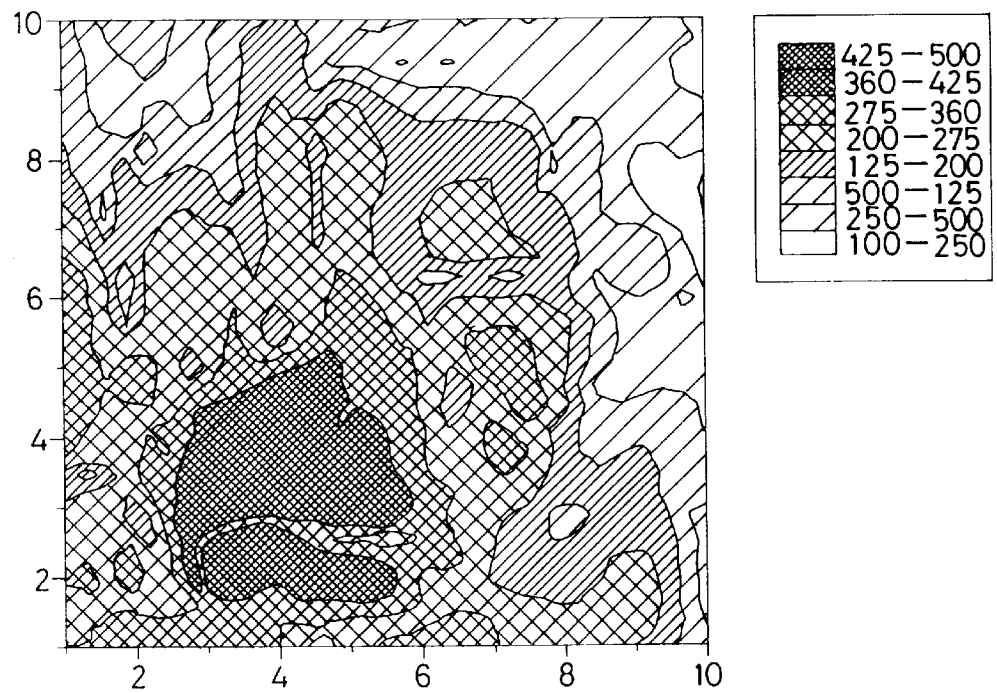
FIG. 11A shows the result of measuring magnetic field in a board to which the present invention is not applied.
Figure 11B:
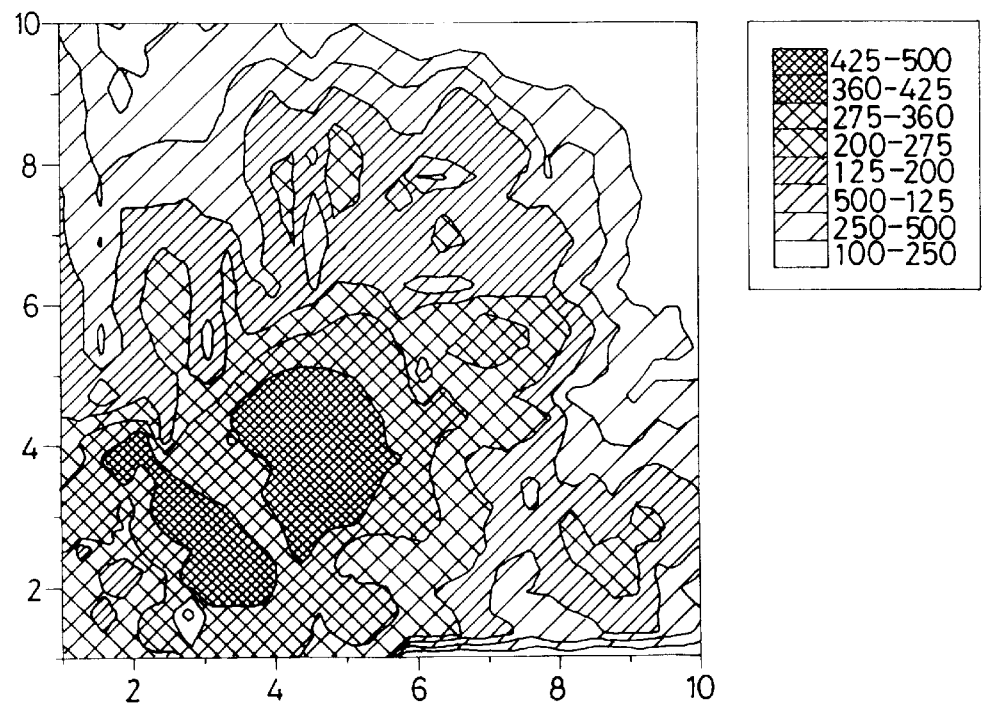
FIG. 11B shows the result of measuring magnetic field in a board to which the present invention is applied.

FIGS. 11A and 11B show the results of measuring nearby magnetic field profiles obtained by scanning a magnetic field measuring probe on an original board having a complete planar power supply layer and a board (EWS) having a power supply layer wired in accordance with the present invention. FIG. 11A shows the result for the original board, whereas FIG. 11B shows the result for the board having a power supply layer to which an impedance imparting circuit is applied. The measurement was carried out at a frequency of 80 MHz corresponding to a two times wave of a clock frequency (40 MHz). In FIGS. 11A and 11B, deep colored areas indicate areas having high magnetic field intensity, and lighter colored areas indicate areas having smaller magnetic field intensity. In FIGS. 11A and 11B, there are disposed CPU and a large LSI as noise sources at a left and lower deep-colored portion.

Comparing the nearby magnetic field profile illustrated in FIG. 11A to that of FIG. 11B, it is found out that the nearby magnetic field profile of FIG. 11B has greater magnetic field intensity at a left and lower portion at which CPU and a large LSI are disposed, and has smaller magnetic field intensity at a right and upper portion (namely, diffusion to surroundings is reduced).

This means that a high frequency power supply current derived from CPU and/or a large LSI acting as noise sources are efficiently bypassed to a ground line through the decoupling capacitors disposed in parallel with the CPU or LSI, and hence a current to flow into other LSI/ICs is reduced. Thus, it is proved that decoupling effect caused by isolation of LSI/ICs from one another by means of wiring is enhanced.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A multi-layered printed wiring board comprising:
   at least one power supply layer;
   at least one ground layer;
   at least one signal layer; and
   insulators sandwiched between said layers,
   said at least one power supply layer being provided thereon with a circuit in the form of branch wirings enhancing high frequency impedance to provide high frequency isolation between circuit elements disposed on said printed wiring board.

2. The multi-layered printed wiring board as set forth in claim 1, wherein insulators sandwiching said power supply layer therebetween contain magnetic substance therein that increases the inductance of said at least one power supply layer.

3. The multi-layered printed wiring board as set forth in claim 2, wherein said insulators other than said magnetic substance containing insulators are insulators having only dielectric characteristics.

4. The multi-layered printed wiring board as set forth in claim 2, wherein said insulators sandwiching said at least one power supply layer therebetween is made of mixture of ferrite power and resin.

5. A multi-layered printed wiring board comprising:
   at least one power supply layer;
   at least one around layer;
   at least one signal layer; and
   insulators sandwiched between said layers,
   said at least one power supply layer being provided thereon with a circuit in the form of branch wirings for imparting impedance thereto,
   wherein said at least one power supply layer is interposed between ground layers with said insulators arranged on either side of said power supply layer sandwiched between said power supply layer and each of said ground layers.

6. The multi-layered printed wiring board as set forth in claim 5, wherein said ground layers are complete planar layers having no wirings thereon and having only through holes and via holes.

7. A multi-layered printed wiring board comprising:
   at least one power supply layer;
   at least one ground layer;
   at least one signal layer; and
   insulators sandwiched between said layers,
   said at least one power supply layer being provided thereon with a circuit in the form of branch wirings for imparting impedance thereto,
   wherein said impedance imparting circuit is composed of line patterns providing a greater inductance in limited regions than an inductance to be generated in other regions.

8. A multi-layered printed wiring board comprising:
   at least one power supply layer;
   at least one around layer;
   at least one signal layer; and
   insulators sandwiched between said layers,
   said at least one power supply layer being provided thereon with a circuit in the form of branch wirings for imparting impedance thereto,
   wherein said impedance imparting circuit is composed of at least one of winding, intersecting and spiral line patterns.

9. The multi-layered printed wiring board as set forth in claim 8, wherein said spiral line pattern is in direct connection with said power supply layer at one end and is in connection with said power supply layer at the other end through one of said ground layer and a surface layer.

10. A multi-layered printed wiring board comprising:
    at least one power supply layer;
    at least one ground layer;
    at least one signal layer; and
    insulators sandwiched between said layers,
    said at least one power supply layer being provided thereon with a circuit in the form of branch wirings for imparting impedance thereto
    wherein insulators sandwiching said power supply layer therebetween contain magnetic substance therein,
    wherein said magnetic substance containing insulators have magnetic permeability having both a real number part which is not decreased in a predetermined frequency band and an imaginary number part which has uniform characteristics in said predetermined frequency band.

11. The multi-layered printed wiring board as set forth in claim 10, wherein said real number part tends to be decreased in a small degree at a frequency greater than a predetermined frequency and said imaginary number part tends to be increased in a small degree at a frequency greater than said predetermined frequency.

12. A multi-layered printed wiring board comprising:
    at least one power supply layer;
    at least one ground layer;
    at least one signal layer; and
    insulators sandwiched between said layers,
    said at least one power supply layer being provided thereon with a circuit in the form of branch wirings for imparting impedance thereto
    wherein insulators sandwiching said power supply layer therebetween contain magnetic substance therein,
    wherein said insulators contain magnetic substance having hysteresis characteristic which is not saturated, but excited with a dc current running through circuits mounted on said multi-layered printed wiring board and operated independently with each other.

13. The multi-layered printed wiring board as set forth in claim 12, wherein said insulators contain magnetic substance having both relatively great saturation magnetic flux density and relatively small residual magnetic flux density.

14. A multi-layered printed wiring board comprising:
at least one power supply layer;
at least one ground layer;
at least one signal layer; and
insulators sandwiched between said layers,
said at least one power supply layer being provided thereon with a circuit in the form of branch wirings for imparting impedance thereto
wherein insulators sandwiching said power supply layer therebetween contain magnetic substance therein,
wherein said insulators sandwiching said at least one power supply layer therebetween is made of one of a sintered ferrite and a mixture of ferrite powder and resin.

15. A multi-layered printed wiring board comprising:
at least one power supply layer;
at least one around layer;
at least one signal layer; and
insulators sandwiched between said layers,
said at least one power supply layer being provided thereon with a circuit in the form of branch wirings for imparting impedance thereto
wherein insulators sandwiching said power supply layer therebetween contain magnetic substance therein,
wherein said insulators sandwiching said at least one power supply layer therebetween is made of NiZn family sintered ferrite.

16. A multi-layered printed wiring board comprising:
at least one power supply layer including main wirings for distributing a dc current entirely to said printed wiring board with a dc voltage drop being depressed, and branch wirings for enhancing high frequency impedance to isolate circuits in terms of high frequency, which circuits are mounted on said multi-layered printed wiring board and operated independently with each other;
at least one ground layer;
at least one signal layer; and
insulators sandwiched between said layers.

17. The multi-layered printed wiring board as set forth in claim 16, wherein insulators sandwiching said supply layer therebetween contain magnetic substance therein.

18. The multi-layered printed wiring board as set forth in claim 17, wherein said insulators other than said magnetic substance containing insulators are insulators having only dielectric characteristics.

19. The multi-layered printed wiring board as set forth in claim 17, wherein said magnetic substance containing insulators have magnetic permeability having both a real number part which is not decreased in a predetermined frequency band and an imaginary number part which has uniform characteristics in said predetermined frequency band.

20. The multi-layered printed wiring board as set forth in claim 17, wherein said insulators contain magnetic substance having hysteresis characteristic which is not saturated, but excited with a dc current running through circuits mounted on said multi-layered printed wiring board and operated independently with each other.

21. The multi-layer printed wiring board as set forth in claim 16, wherein said at least one power supply layer is interposed between said ground layers with said insulators arranged on either side of said at least one power supply layer sandwiched between said at least one power supply layer and each of said ground layers.

22. The multi-layered printed wiring board as set forth in claim 21, wherein said ground layers are complete planar layers having no wirings thereon and having only through holes and via holes.

23. The multi-layered printed wiring board as set forth in claim 16, wherein said branch wirings are composed of line patterns providing a greater inductance in limited regions than an inductance to be generated in other regions.

24. The multi-layered printed wiring board as set forth in claim 16, wherein said branch wirings are composed of at least one of winding, intersecting and spiral line patterns.

* * * * *